(12) United States Patent
Zeng et al.

(10) Patent No.: US 11,646,228 B2
(45) Date of Patent: May 9, 2023

(54) STEALTH DICING METHOD INCLUDING FILAMENTATION AND APPARATUS THEREOF

(71) Applicants: Chongqing Institute of East China Normal University, Chongqing (CN); East China Normal University, Shanghai (CN); University of Shanghai for Science and Technology, Shanghai (CN)

(72) Inventors: Heping Zeng, Chongqing (CN); Shuai Yuan, Chongqing (CN); Yingsheng Du, Chongqing (CN); Hui Xu, Chongqing (CN); Yuan Nie, Chongqing (CN); Yong Wang, Chongqing (CN); Jin Wang, Chongqing (CN); Jue Yu, Chongqing (CN); Yanying Ma, Chongqing (CN)

(73) Assignees: CHONGQING INSTITUTE OF EAST CHINA NORMAL UNIVERSITY, Chongqing (CN); EAST CHINA NORMAL UNIVERSITY, Shanghai (CN); UNIVERSITY OF SHANGHAI FOR SCIENCE AND TECHNOLOGY, Shanghai (CN)

( * ) Notice: Subject to any disclaimer, the term of this patent is extended or adjusted under 35 U.S.C. 154(b) by 408 days.

(21) Appl. No.: 16/926,842

(22) Filed: Jul. 13, 2020

(65) Prior Publication Data

US 2021/0074585 A1 Mar. 11, 2021

(30) Foreign Application Priority Data

Sep. 11, 2019 (CN) .......................... 201910857191.6
Sep. 11, 2019 (CN) .......................... 201910857217.7

(51) Int. Cl.
*H01L 21/78* (2006.01)
*H01L 21/268* (2006.01)
(Continued)

(52) U.S. Cl.
CPC ............ *H01L 21/78* (2013.01); *B23K 26/064* (2015.10); *B23K 26/0624* (2015.10);
(Continued)

(58) Field of Classification Search
CPC ... H01L 21/78; H01L 21/268; B23K 26/0624; B23K 26/064; B23K 26/0665;
(Continued)

(56) References Cited

U.S. PATENT DOCUMENTS

2007/0202619 A1* 8/2007 Tamura ................... B28D 5/00
438/22
2012/0255935 A1* 10/2012 Kakui .................... B23K 26/40
219/121.6
(Continued)

FOREIGN PATENT DOCUMENTS

CN 101391860 3/2009
CN 103079747 5/2013
(Continued)

OTHER PUBLICATIONS

Chin, S. et al. (2008). Some Fundamental Concepts of Femtosecond Laser Filamentation. In: Progress in Ultrafast Intense Laser Science III. Springer Series in Chemical Physics, vol. 89. Springer, Berlin, Heidelberg, https://doi.org/10.1007/978-3-540-73794-0_12, pp. 243-264 (Year: 2008).*

(Continued)

*Primary Examiner* — John P. Dulka
(74) *Attorney, Agent, or Firm* — Hodgson Russ LLP

(57) ABSTRACT

The present disclosure provides a stealth dicing method and apparatus. With the method, the focusing element focuses
(Continued)

the laser beam on the surface of material to be diced, and the dynamic-equilibrium plasma channel is formed in the material to be diced by means of self-focusing and defocusing effect of plasma generated by ionizing the material to be diced. The modified layer may be formed in the material to be diced throughout the plasma channel, so as to realize stealth dicing.

8 Claims, 2 Drawing Sheets

(51) Int. Cl.
  *B23K 26/064* (2014.01)
  *B23K 26/08* (2014.01)
  *B23K 26/06* (2014.01)
  *B23K 26/0622* (2014.01)
  *B23K 26/402* (2014.01)
  *B23K 26/53* (2014.01)
  *B23K 26/073* (2006.01)
  *B23K 103/00* (2006.01)

(52) U.S. Cl.
  CPC ........ *B23K 26/0665* (2013.01); *B23K 26/073* (2013.01); *B23K 26/0861* (2013.01); *B23K 26/402* (2013.01); *B23K 26/53* (2015.10); *H01L 21/268* (2013.01); *B23K 2103/50* (2018.08); *B23K 2103/56* (2018.08)

(58) Field of Classification Search
  CPC .......... B23K 26/073; B23K 26/0861; B23K 26/402; B23K 26/53; B23K 2103/50; B23K 2103/56; B23K 26/082
  See application file for complete search history.

(56) References Cited

U.S. PATENT DOCUMENTS

| | | | | |
|---|---|---|---|---|
| 2013/0126573 | A1* | 5/2013 | Hosseini | B23K 26/0006 225/2 |
| 2015/0151380 | A1* | 6/2015 | Hosseini | B23K 26/53 219/121.72 |
| 2016/0167166 | A1* | 6/2016 | Nagano | B23K 26/046 219/121.78 |
| 2020/0101561 | A1* | 4/2020 | Ortner | B23K 26/083 |

FOREIGN PATENT DOCUMENTS

| | | | | |
|---|---|---|---|---|
| CN | 104768698 | | 7/2015 | |
| CN | 106853555 | | 6/2017 | |
| CN | 107962305 | | 4/2018 | |
| EP | 2944412 | A1 * | 11/2015 | ......... B23K 26/0057 |

OTHER PUBLICATIONS

SIPO, First Office Action for CN Application No. 201910857191.6, dated Oct. 28, 2020.
SIPO, First Office Action for CN Application No. 201910857217.7, dated Oct. 30, 2020.

* cited by examiner

STEALTH DICING METHOD INCLUDING FILAMENTATION AND APPARATUS THEREOF

CROSS REFERENCE TO RELATED APPLICATIONS

This application claims priority to Chinese Patent Application No. 201910857217.7, filed Sep. 11, 2019, and Chinese Patent Application No. 201910857191.6, filed Sep. 11, 2019, the entire disclosures of which are incorporated herein by reference.

TECHNICAL FIELD

The present disclosure relates to a field of laser processing technologies, and more particularly, to a stealth dicing method and apparatus.

BACKGROUND

With development of the laser processing technologies, the stealth dicing technology, as a new method of effectively dicing material, has become more and more important and has advantages of high efficiency, low damage and flat facet compared to a traditional laser dicing technology.

However, the existing stealth dicing technology may damage the material to be diced. Further, since multiple modified layers need to be formed in the material by repeatedly scanning the material with the laser, the process is time-wasting and low in efficiency. The facet may be not flat due to the shift of vertical focus points, such that it is hard to realize the ideal flatness of the facet. Thus, the existing stealth dicing technology cannot meet the requirement of producing high-precision chips in batch. It is urgent to provide a stealth dicing technology with high efficiency, causing low damage to the material to be diced and flat facet.

SUMMARY

The present disclosure aims to solve at least one of the above problems.

Accordingly, a first objective of the present disclosure is to provide a stealth dicing method and apparatus, which may effectively solve the problem of poor flatness of the facet and low efficiency caused by repeatedly scanning material to be diced.

According to a first aspect of embodiments of the present disclosure, a stealth dicing method is provided, including: generating, by a laser, a laser beam of femtosecond pulses, and focusing by a focusing element the laser beam on a surface of material to be diced to form light filament in the material to be diced, wherein a peak power of the laser beam is greater than a power threshold of forming the light filament in the material to be diced; generating a dynamic-equilibrium plasma channel in the material to be diced by means of self-focusing and defocusing effect of plasma generated by ionizing the material to be diced; forming a modified layer through the plasma channel to realize the stealth dicing of the material to be diced.

Further, the peak power of the laser beam is larger than $10^{12}$ W/cm$^2$.

Further, the plasma channel has a length in a range of 1-3 cm, and has a diameter in a range of 10-100 μm.

Further, the material to be diced is at least one of silicon, silicon carbide, sapphire and semiconductor.

According to a second aspect of embodiments of the present disclosure, a stealth dicing apparatus is provided, including: a laser light source, a light beam controller, a workbench, and a control system; the laser light source comprises a laser and a collimator, the laser is configured to generate laser beam of femtosecond pulses, and an input end of the collimator is connected to the laser, an output end of the collimator is configured to output collimated laser beam of femtosecond pulses; the light beam controller comprises a high reflective mirror and a focusing element, the high reflective mirror is configured to reflect the collimated laser beam to the focusing element, the focusing element is configured to adjust a spot size and a depth of focus so that the collimated laser beam is focused on a surface of material to be diced; the workbench includes a three-dimensional mobile platform and a CCD camera, the three-dimensional mobile platform is configured to fix the material to be diced, and the CCD camera is disposed above the material to be diced and configured to detect a position of a focus point in real time for automatically correcting the focus point; and the control system is connected to the laser light source, the light beam controller and the workbench, respectively, and configured to control the laser light source, the light beam controller and the workbench to communicate and coordinate with each other.

Further, the laser is selected from a group of a solid laser, a gas laser and a fiber laser, and an output wavelength of the laser is ultraviolet light of 200-400 nm, visible light of 400-700 nm or infrared light of 700-1000 nm.

With the stealth dicing method according to the first aspect of embodiments of the present disclosure, the focusing element focuses the laser beam on the surface of material to be diced, and the dynamic-equilibrium plasma channel is formed in the material to be diced by means of self-focusing and defocusing effect of plasma generated by ionizing the material to be diced. That is, the light filament is formed by a single focusing. The light filament has a high energy density and an essential constant diameter. Due to intensity clamping of the light filament and a propagation length greater than the Rayleigh length, the modified layer may be formed in the material to be diced throughout the entire light filament range. The modified layer is a fragile entity that is of looseness in structure and easy to break, and a facet of the modified layer is flat without thermal damage to the material to be diced. The stealth dicing based on light filament is realized by fission processing. By dicing the material to be diced through the plasma channel, an effective length of a single dicing processing is lengthened, such that larger and thicker rigid material can be diced, thus realizing "dicing once" without repeatedly scanning the material. The dicing efficiency is improved, the damage to the material is decreased, and the flatness of the facet is improved.

Further, compared to the existing stealth dicing technology, the laser beam of femtosecond pulses are focused on the surface of the material to be diced, such that it is unnecessary to generate many focus points in the material to be diced, thus reducing a possibility of defocusing due to the dicing based on many focus points or the repeat scanning of material, enabling the facet to be flatter, and improving the yield rate.

According to a third aspect of embodiments of the present disclosure, a stealth dicing method is provided, including: generating, by a laser light source, a plurality of laser beams of different wavelengths, and adjusting a direction and a spot size of the plurality of laser beams to enable the plurality of laser beams to be vertically incident upon a surface of material to be diced; generating a dynamic-equilibrium laser channel by means of self-focusing and defocusing effect of plasma; and forming a plurality of light filaments of ultra-short pulses at a plurality of positions in the laser channel, wherein the plurality of light filaments are connected spatially and form coherence stack at each connecting position so as to lengthen an entire length of the light filaments in the material to be diced.

Further, a pulse width of the light filament of ultra-short pulse is less than two picoseconds.

Further, the plurality of laser beams include a red laser beam, a blue laser beam, a green laser beam and a yellow laser beam.

Further, a wavelength of the blue laser beam is 400 nm, a wavelength of the blue green beam is 532 nm, a wavelength of the yellow laser beam is 600 nm, and a wavelength of the red laser beam is 700 nm.

Further, the material to be diced is at least one of silicon, silicon carbide, sapphire and semiconductor.

According to a fourth aspect of embodiments of the present disclosure, a stealth dicing apparatus is provided, including: a laser light source, a light beam adjuster, a mobile workbench, and a control system; the laser light source is configured to generate a plurality of laser beams of different wavelengths; the light beam adjuster comprises an optical element and a focusing element, the optical element has an input end connected to an output end of the laser light source via fiber and is configured to adjust a transfer direction of the laser beam; the focusing element has an input end connected to an output end of the optical element, and is configured to adjust a spot size of the laser beam; the mobile workbench is configured to fix the material to be diced, and is movable in six directions; and the control system is connected respectively to the laser light source and the mobile workbench via a computer, and configured to control the laser light source and the workbench to communicate and coordinate with each other.

Further, the laser light source is selected from a group of a solid laser, a gas laser and a fiber laser, and an output wavelength of the laser is ultraviolet light of 200-400 nm, visible light of 400-700 nm or infrared light of 700-1000 nm.

Further, the apparatus includes a cooling system connected respectively to the laser light source, the light beam adjuster and the material to be diced. The cooling system is connected to the laser light source so as to prevent the laser beam from influence of temperature. The cooling system is connected to the light beam adjuster to protect the optical element and the focusing element from deformation due to thermal effect. The cooling system is connected to the material to be diced to prevent the material to be diced from qualitative change due to influence of temperature.

With the stealth dicing method according embodiments of the present disclosure, a plurality of laser beams of different wavelengths are considered as the incident light source, and a plurality of light filaments of ultra-short pulses are formed in the material to be diced by means of self-focusing and defocusing effect of plasma generated. The light filament has a high energy density and an essential constant diameter. Due to intensity clamping of the light filament and a propagation length greater than the Rayleigh length, the light filament can be used as the light source for dicing the material. The plurality of light filaments of ultra-short pulses are connected spatially with overlapping each other and form coherence stack at each connecting position so as to lengthen an entire length of the light filaments in the material to be diced and lengthen an effective length in a single dicing processing, such that larger and thicker rigid material can be diced, thus realizing "dicing once" without repeatedly scanning the material. The dicing efficiency is improved, the damage to the material is decreased, and the flatness of the facet is improved.

The plasma generated by ionizing of each of the plurality of light filaments of ultra-short pulses within a spatial overlapping area is affected by the former and later light filaments, such that the cascade ionizing and collision ionizing may be caused to realize the dicing of the thicker material with lower power.

BRIEF DESCRIPTION OF THE DRAWINGS

The above and/or additional aspects and advantages of embodiments of the present disclosure will become apparent and more readily appreciated from the following descriptions made with reference to the drawings, in which.

DETAILED DESCRIPTION

Figure 1:
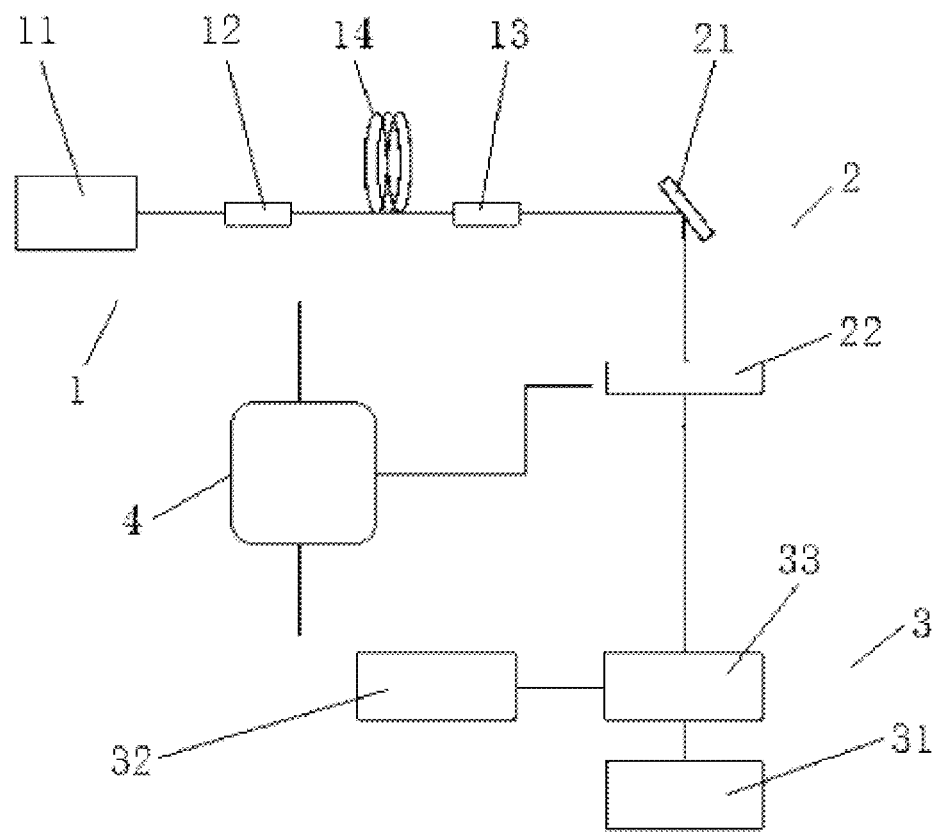
FIG. 1 is a schematic diagram illustrating a structure of a stealth dicing apparatus according to an embodiment of the present disclosure.

Embodiments of the present disclosure will be described in detail and examples of embodiments are illustrated in the drawings. The same or similar elements and the elements having the same or similar functions are denoted by like reference numerals throughout the descriptions. Embodiments described herein with reference to drawings are explanatory, serve to explain the present disclosure, and are not construed to limit embodiments of the present disclosure.

In the specification, it is to be understood that terms such as "central," "longitudinal," "lateral," "length," "width," "thickness," "upper," "lower," "front," "rear," "left," "right," "vertical," "horizontal," "top," "bottom," "inner," "outer," should be construed to refer to the orientation as then described or as shown in the drawings under discussion. These relative terms are for convenience of description and do not require that the present invention be constructed or operated in a particular orientation. In addition, terms such as "first" and "second" are used herein for purposes of description and are not intended to indicate or imply relative importance or significance or to imply the number of indicated technical features.

In the present invention, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

With reference to FIG. 1, the stealth dicing apparatus includes a laser light source 1, a light beam controller 2, a workbench 3, and a control system 4. The laser light source 1 is configured to generate a laser beam of light filament. The light beam controller 2 is configured to adjust a direction of propagation and a spot size of the laser beam. The workbench 3 is configured to fix the material 33 to be diced so as to realize dicing from all-dimensional angles and to monitor a position of a focus point and automatically correct in real time. The control system 4 is configured to control these components to communicate and coordinate with each other.

The laser light source 1 includes a laser 11, a first collimator 12 and a second collimator 13. The laser is configured to generate a laser beam of femtosecond pulses. The laser may be a solid laser, a gas laser or a fiber laser. An output wavelength of the laser is ultraviolet light of 200-400 nm, visible light of 400-700 nm or infrared light of 700-1000 nm. An input end of the first collimator 12 is connected to the laser 11, and configured to collimate and couple the laser beam of femtosecond pulses to a fiber 14 for transmission. The fiber 14 is configured to transmit the laser beam, improving a flexibility and safety of the optical path system. The second collimator 13 is configured to collimate and output the laser beam of femtosecond pulses from the fiber 14.

The light beam controller 2 includes a high reflective mirror 21 and a focusing element 22. The high reflective mirror 21 is configured to receive the laser beam of femtosecond pulses output the second collimator 13, change a transmission direction of the laser beam, so as to focus the reflected laser beam to the focusing element 22. The focusing element 22 is configured to adjust a spot size and a depth of focus so that the laser beam is focused on a surface of material to be diced. The focusing element 22 may be a lens, a mirror, an off-axis parabolic mirror, a phase plate or other optical elements having a focusing functionality.

The workbench 3 includes a three-dimensional mobile platform 31 and a CCD camera 32. The three-dimensional mobile platform 31 is configured to fix the material 33 to be diced and is movable in any direction to meet different dicing requirements. The CCD camera 32 is disposed above the material 33 to be diced and configured to detect a position of a focus point in real time and automatically correct the focus point by means of the auto-focusing technology of the CCD camera, so as to realize an automatic apposition dicing, thus improving an accuracy of dicing the material.

The control system 4 is connected to the laser light source 1, the light beam controller 2 and the workbench 3, respectively, and configured to control the laser light source 1, the light beam controller 2 and the workbench 3 to communicate and coordinate with each other, so as to improving a dicing efficiency.

With the stealth dicing method, the laser 11 generates a laser beam of femtosecond pulses, the focusing element 22 focuses the laser beam which has a peak power greater than a power threshold of forming the light filament in the material 33 to be diced on a surface of material 33 to be diced to form light filament in the material 33 to be diced, so as to generate a dynamic-equilibrium plasma channel in the material to be diced by means of self-focusing and defocusing effect of plasma generated by ionizing the material to be diced and form a modified layer through the plasma channel to realize the stealth dicing of the material to be diced. The plasma channel has a length in a range of 1-3 cm, and has a diameter in a range of 10-100 μm.

Compared to the laser beam which has the peak power greater than $10^{14}$ W/cm$^2$ for forming the light filament in air, the laser beam, which has the peak power greater than $10^{12}$ W/cm$^2$, may have a lower requirement in the peak power for forming the light filament in the material to be diced, such that the dicing can be realized under lower power.

By adjusting related parameters of the laser beam of femtosecond pulses based on type of the material to be diced, the length and the diameter of the plasma channel can be adjusted to enable the plasma channel to penetrate through the material to be diced once, thus realizing "dicing once".

The focusing element focuses the laser beam on the surface of material to be diced, and the dynamic-equilibrium plasma channel is formed in the material to be diced by means of self-focusing and defocusing effect of plasma generated by ionizing the material to be diced. That is, the light filament is formed in the material to be diced by a single focusing. The light filament has a high energy density and an essential constant diameter. Due to intensity clamping of the light filament and a propagation length greater than the Rayleigh length, the modified layer may be formed in the material to be diced throughout the entire light filament range. The modified layer is a fragile entity that is of looseness in structure and easy to break, and a facet of the modified layer is flat without thermal damage to the material to be diced. The stealth dicing based on light filament is realized by fission processing. By dicing the material to be diced through the plasma channel, an effective length of a single dicing processing is lengthened, such that larger and thicker rigid material including silicon, silicon carbide, sapphire and semiconductor can be diced, thus realizing "dicing once". Compared to the traditional dicing based on multilayer scanning, the stealth dicing technology of the present disclosure improves a velocity of stealth dicing by a factor of 5, such that the dicing efficiency is improved, the damage to the material is decreased, and the flatness of the facet is improved.

The present disclosure further provides a stealth dicing method according to another embodiment. The stealth dicing method includes: simultaneously generating, by a laser light source, a plurality of laser beams of different wavelengths, and adjusting a direction and a spot size of the plurality of laser beams to enable the plurality of laser beams to be vertically incident upon a surface of material to be diced; generating a dynamic-equilibrium laser channel by means of self-focusing and defocusing effect of plasma; and forming a plurality of light filaments of ultra-short pulses at a plurality of positions in the laser channel, in which a pulse width of the light filament of ultra-short pulse is less than two picoseconds and the plurality of light filaments are overlapped in partial spatially and form coherence stack at each connecting position so as to lengthen an entire length of the light filaments in the material to be diced.

As a preferred embodiment, the laser light source generated four laser beams, which include a red laser beam, a blue laser beam, a green laser beam and a yellow laser beam. A wavelength of the blue laser beam is 400 nm, a wavelength of the blue green beam is 532 nm, a wavelength of the yellow laser beam is 600 nm, and a wavelength of the red laser beam is 700 nm.

When the laser pulse transmits in air, a dynamic equilibrium can be achieved due to self-focusing and defocusing effect of plasma generated by ionizing the air, such that a long and stable laser channel can be formed in the air. Since the incident laser includes a plurality of laser beams of different wavelengths, the light filament of ultra-short pulse can be formed at different positions of the laser channel, the light filament has a high energy density and an essential constant diameter across a long distance, such that the light filament can be used to dice the material to be diced.

Figure 2:
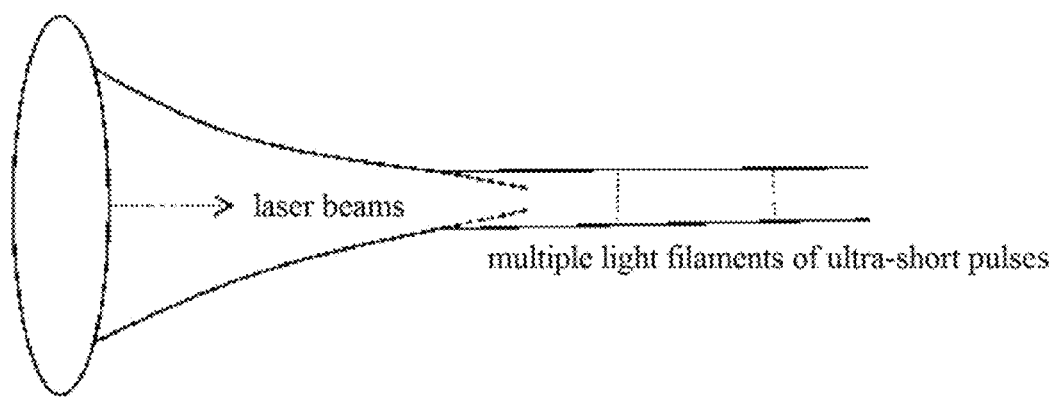
FIG. 2 is a schematic diagram of a plurality of light filaments of ultra-short pulses according to an embodiment of the present disclosure.

With reference to FIG. 2, the laser beams of different wavelengths have different power thresholds for forming the light filaments in the material to be diced, such that the light filaments have different starting positions in the material to be diced, which can be calculated by a formula of:

$$z_f = \frac{0.367 k a_0^2}{\left\{\left[\left(\frac{P}{Pc}\right)^{\frac{1}{2}} - 0.852\right]^2 - 0.0219\right\}^{\frac{1}{2}}},$$

where Zf represents a starting position of a light filament, k represents a laser wavenumber, $a_0$ represents a radius of a laser beam under an intensity of 1/e, P represents a peak power of the laser beam, Pc represents a power threshold of the laser beam for forming the light filament in the material to be diced.

The blue laser of 400 nm, the green laser of 532 nm, the yellow laser of 600 nm and the red laser of 700 nm form the light filaments in different areas of a propagation path. The light filaments starting from different positions may be connected to each other spatially, such that the length of light filament is lengthened, thus realizing "dicing once".

Figure 3:
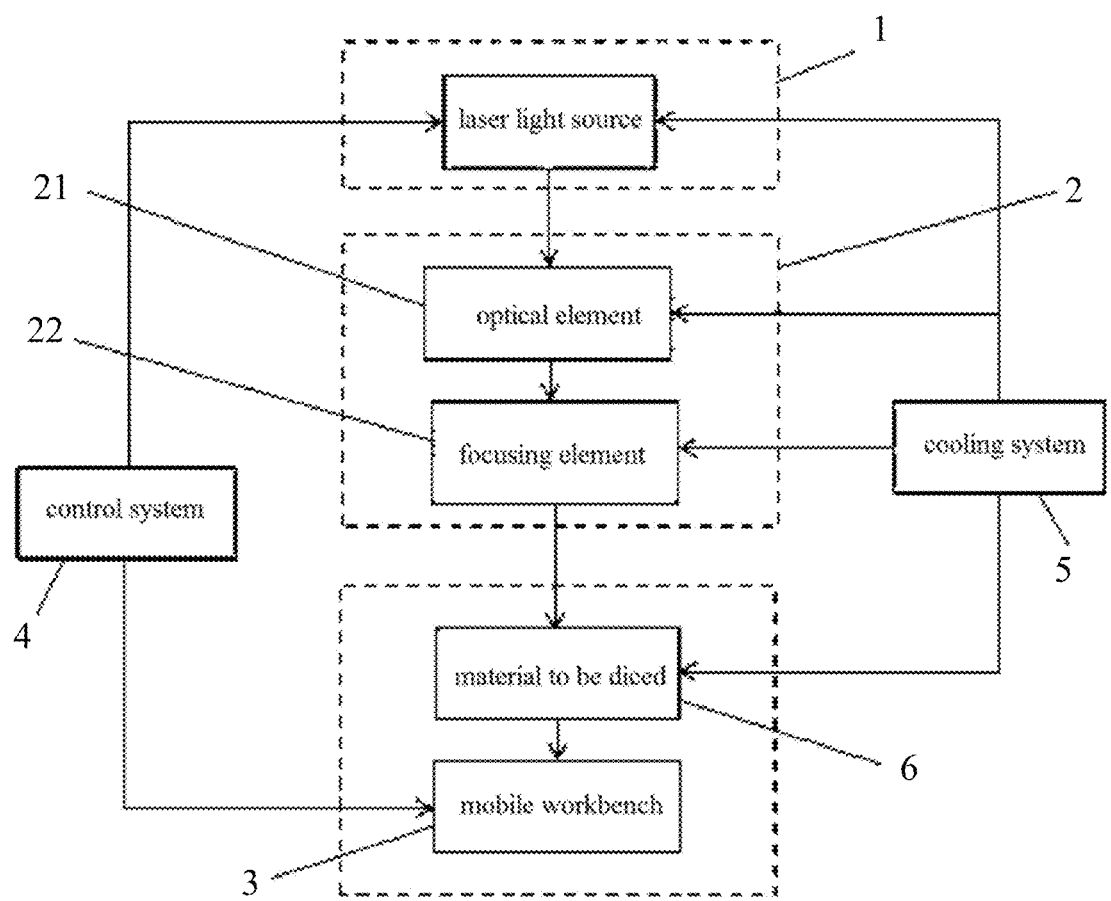
FIG. 3 is a schematic diagram illustrating a structure of a stealth dicing apparatus according to another embodiment of the present disclosure.

With reference to FIG. 3, a stealth dicing apparatus includes a laser light source 1, a light beam adjuster 2, a mobile workbench 3, a control system 4 and a cooling system 5. The laser light source 1 is configured to provide a plurality of laser beams of different wavelengths for the material to be diced. The light beam adjuster 2 is configured to adjust a propagation direction and a spot size of the laser beams. The mobile workbench 3 is configured to provide a platform for disposing the material 6 to be diced, and is configured to control a relative displacement between the material to be diced and the platform so as to obtain different dicing patterns such as a straight line, a curve or the like. The control system 4 is configured to control an output power of the laser light source 1 and to realize precise control on the mobile workbench 3. The cooling system is configured to realize a temperature control of the whole apparatus, to ensure that each component can work stably for a long time. The laser light source 1 is selected from a group of a solid laser, a gas laser and a fiber laser, and an output wavelength of the laser is ultraviolet light of 200-400 nm, visible light of 400-700 nm or infrared light of 700-1000 nm, such that a plurality of laser beams of different wavelengths can be generated.

The light beam adjuster 2 includes an optical element 21 and a focusing element 22. The optical element 21 includes a plurality of refractors and reflectors, and has an input end connected to an output end of the laser light source 1 via fiber and is configured to adjust a transfer direction of the laser beam. The focusing element includes a plurality of focusing lenses and parabolic mirrors, has an input end connected to an output end of the optical element, and is configured to adjust a spot size of the laser beam so as to focus the laser beams to a minimal point, thus improving the optical power density.

The mobile workbench 3 is configured to fix the material 6 to be diced and is movable in multiple directions, such as moves upwardly and downwardly, moves to left and to right, moves forwardly and backwardly. A spatial position of the material to be diced can be adjusted through a displacement of the mobile workbench, thus realizing dicing in different patterns.

The control system 4 is connected respectively to the laser light source 1 and the mobile workbench 3 via a computer, and is configured to control the laser light source 1 to switch on or off, control a movement of the mobile workbench 3, so as to enable the components in the whole apparatus to work coordinately.

The cooling system 5 is connected to the laser light source to prevent the laser beams from influence of temperature. The cooling system 5 is connected to the light beam adjuster 2 to protect the optical element 21 and the focusing element 22 from deformation due to thermal effect. The cooling system 5 is connected to the material 6 to be diced to prevent the material 6 to be diced from qualitative change due to influence of temperature. The cooling system 5 may conduct surplus thermal so as to ensure that the temperature of each component of the apparatus is constant, such that the apparatus can work for a long time.

The benefits of the present disclosure will be shown by means of the following experiment.

In a first comparison case, a monochrome infrared laser with wavelength of 1030 nm is used as the incident light source. In a second comparison case, a monochrome ultraviolet laser with wavelength of 400 nm is used as the incident light source. In a third comparison case, a monochrome ultraviolet multi-focal laser with wavelength of 400 nm is used as the incident light source.

In an experiment case, laser beams including a blue laser of 400 nm, a green laser of 532 nm, a yellow laser of 600 nm and a red laser of 700 nm is used as the incident light source.

The material to be diced is sapphire having a length of 2 cm, a width of 1.5 cm and a thickness of 1 cm. Data such as the dicing time and the laser power is collected, as shown in table 1.

TABLE 1 dicing data

| | First comparison case | Second comparison case | Third comparison case | Experiment case |
|---|---|---|---|---|
| Time (second) | 109 | 55 | 7 | 1.5 |
| Laser power (micro joule) | 100 | 34 | 65 | 107 |

It can be seen from table 1 that the time required for dicing in the experiment case is greatly less than the comparison cases. Compared to the dicing using monochrome infrared laser, the dicing using the polychrome laser beams can improve the dicing efficiency by a factor of 73. Since the stealth dicing using the polychrome laser beams can realize "dicing once" without repeatedly scanning, the damage to the material is reduced, and the flatness of the facet is improved.

What is claimed is:
1. A stealth dicing method, comprises:
generating, by a laser light source, a plurality of laser beams of different wavelengths, and adjusting a direction and a spot size of the plurality of laser beams to enable the plurality of laser beams to be vertically incident upon a surface of material to be diced, wherein the plurality of laser beams comprise a red laser beam, a blue laser beam, a green laser beam and a yellow laser beam;
generating a dynamic-equilibrium laser channel by means of self-focusing and defocusing effect of plasma; and
forming a plurality of light filaments of ultra-short pulses at a plurality of positions in the laser channel so as to realize the stealth dicing of the material to be diced, wherein the plurality of light filaments are connected spatially and form coherence stack at each connecting position so as to lengthen an entire length of the light filaments in the material to be diced.

2. The method of claim 1, wherein a pulse width of the light filament of ultra-short pulse is less than two picoseconds.

3. The method of claim 2, wherein the material to be diced is at least one of silicon, silicon carbide, sapphire and semiconductor.

4. The method of claim 1, wherein a wavelength of the blue laser beam is 400 nm, a wavelength of the blue green beam is 532 nm, a wavelength of the yellow laser beam is 600 nm, and a wavelength of the red laser beam is 700 nm.

5. The method of claim 1, wherein the material to be diced is at least one of silicon, silicon carbide, sapphire and semiconductor.

6. A stealth dicing apparatus, comprises: a laser light source, a light beam adjuster, a mobile workbench, and a control system;
wherein the laser light source is configured to generate a plurality of laser beams of different wavelengths;
the light beam adjuster comprises an optical element and a focusing element, the optical element has an input end connected to an output end of the laser light source via fiber and is configured to adjust a transfer direction of the laser beam; the focusing element has an input end connected to an output end of the optical element, and is configured to adjust a spot size of the laser beam;
the mobile workbench is configured to fix the material to be diced, and is movable in six directions; and
the control system is connected respectively to the laser light source and the mobile workbench via a computer, and configured to control the laser light source and the workbench to communicate and coordinate with each other so as to perform:
generating, by a laser light source, a plurality of laser beams of different wavelengths, and adjusting a direction and a spot size of the plurality of laser beams to enable the plurality of laser beams to be vertically incident upon a surface of material to be diced;
generating a dynamic-equilibrium laser channel by means of self-focusing and defocusing effect of plasma; and
forming a plurality of light filaments of ultra-short pulses at a plurality of positions in the laser channel so as to realize the stealth dicing of the material to be diced, wherein the plurality of light filaments are connected spatially and form coherence stack at each connecting position so as to lengthen an entire length of the light filaments in the material to be diced.

7. The apparatus of claim 6, wherein the laser light source is selected from a group of a solid laser, a gas laser and a fiber laser, and an output wavelength of the laser is ultraviolet light of 200-400 nm, visible light of 400-700 nm or infrared light of 700-1000 nm.

8. The apparatus of claim 6, further comprising a cooling system connected respectively to the laser light source, the optical element, the focusing element and the material to be diced.

* * * * *